US011800648B2

(12) United States Patent
Ushiku et al.

(10) Patent No.: US 11,800,648 B2
(45) Date of Patent: Oct. 24, 2023

(54) PATTERN FORMING METHOD

(71) Applicant: Konica Minolta, Inc., Tokyo (JP)

(72) Inventors: Masayuki Ushiku, Yokohama (JP); Hidenobu Ohya, Hachioji (JP); Hideki Hoshino, Kokubunji (JP); Masayoshi Yamauchi, Chofu (JP); Takenori Omata, Kokubunji (JP); Naoto Niizuma, Hachioji (JP); Ryo Aoyama, Hino (JP); Kazuho Urayama, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 108 days.

(21) Appl. No.: 16/971,870

(22) PCT Filed: Feb. 22, 2018

(86) PCT No.: PCT/JP2018/006595
§ 371 (c)(1),
(2) Date: Aug. 21, 2020

(87) PCT Pub. No.: WO2019/163070
PCT Pub. Date: Aug. 29, 2019

(65) Prior Publication Data
US 2021/0084769 A1 Mar. 18, 2021

(51) Int. Cl.
*H05K 3/00* (2006.01)
*H05K 3/12* (2006.01)
(Continued)

(52) U.S. Cl.
CPC ............. *H05K 3/125* (2013.01); *H05K 3/188* (2013.01); *H05K 3/241* (2013.01)

(58) Field of Classification Search
CPC .................................. H05K 3/00; H05K 1/00
See application file for complete search history.

(56) References Cited

U.S. PATENT DOCUMENTS

| 2005/0110397 A1* | 5/2005 | Masuda | H05K 3/125 427/372.2 |
| 2007/0084732 A1* | 4/2007 | Wang | C25D 3/38 205/296 |

(Continued)

FOREIGN PATENT DOCUMENTS

| CN | 106470530 A | | 3/2017 |
| JP | 2015133574 A | * | 7/2015 |

(Continued)

OTHER PUBLICATIONS

JP2015133574A_-_Google_Patents (Year: 2015).*
(Continued)

*Primary Examiner* — Gordon Baldwin
*Assistant Examiner* — Mohammad Mayy
(74) *Attorney, Agent, or Firm* — CANTOR COLBURN LLP

(57) ABSTRACT

A pattern forming method capable of easily removing a discontinuous portion in a pattern while keeping resistance of the pattern low. A pattern forming method including at least a printing step of printing a pattern intermediate containing a conductive material on a base material 1, and a plating step of subjecting the pattern intermediate to an electroplating treatment, in which the pattern intermediate printed in the printing step has a plating target portion that is energized in the plating step and a discontinuous portion that is discontinuously formed from the plating target portion and is not energized in the plating step, and in the plating step, by performing an electric field plating treatment using a plating solution containing at least two or more types of metal salts containing different types of metals and a complexing agent, the discontinuous portion of the pattern intermediate is removed to form a pattern constituted by the plating target portion covered with a plating film.

10 Claims, 2 Drawing Sheets

(51) Int. Cl.
  *H05K 3/18*   (2006.01)
  *H05K 3/24*   (2006.01)

(56) References Cited

U.S. PATENT DOCUMENTS

2009/0015147 A1* 1/2009 Chen ............... H01J 9/205
                                                  313/504
2014/0049504 A1* 2/2014 Cok ............... G06F 3/0446
                                                  345/173

FOREIGN PATENT DOCUMENTS

| JP | 2017039109 A | 2/2017 |
| JP | 2017066493 A | 4/2017 |
| KR | 20170038918 A | 4/2017 |
| WO | WO-2015199201 A1 * | 12/2015 ............... B05D 1/26 |
| WO | 2016190224 A1 | 12/2016 |
| WO | 2017130869 A1 | 8/2017 |

OTHER PUBLICATIONS

KRIPO Notification of Reason for Refusal for corresponding KR Application No. 10-2020-7023911; dated Aug. 11, 2021.
JPO Notice of Reasons for Refusal for corresponding JP Application No. 2020-501936; dated Oct. 26, 2021.
International Search Report for International Application No. PCT/JP2018/006595; dated May 29, 2018.
Written Opinion of the International Search Authority for International Application No. PCT/JP2018/006595; dated May 29, 2018.
CNIPA The First Office Action for corresponding CN Application No. 201880089549.9; dated Feb. 27, 2023.

* cited by examiner

FIG. 1A
FIG. 1B
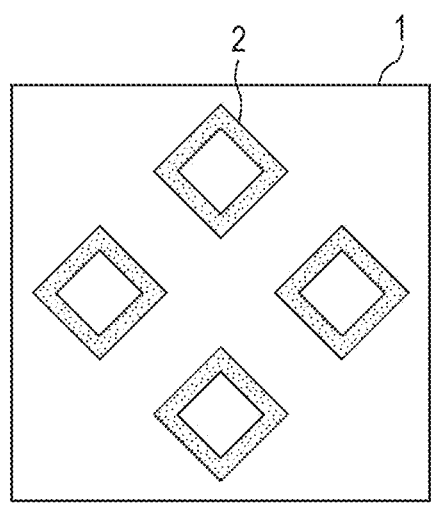
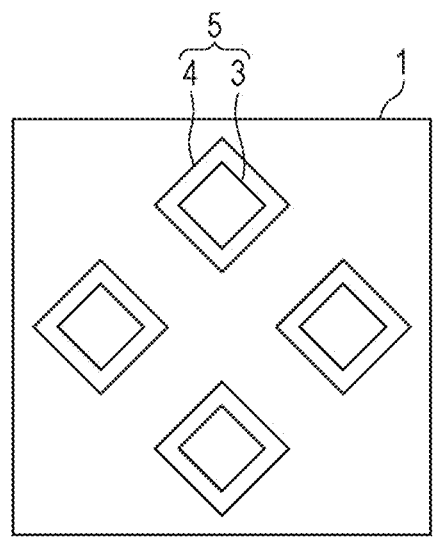
FIG. 1C
FIG. 1D
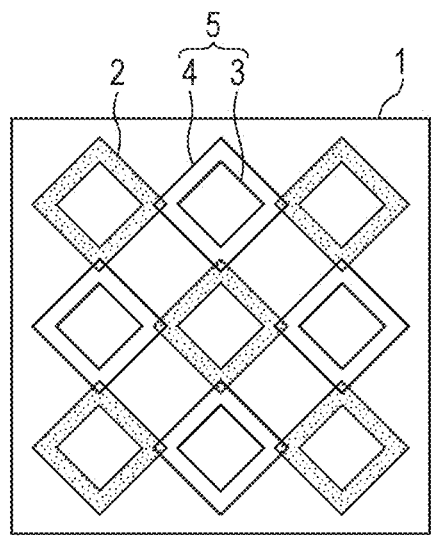
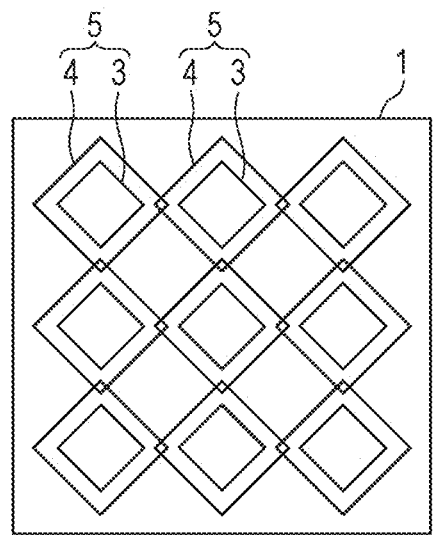

PATTERN FORMING METHOD

CROSS REFERENCE TO PRIOR APPLICATIONS

This is the U.S. national stage of application No. PCT/JP2018/006595, filed on Feb. 22, 2018. Priority is claimed to PCT/JP2018/006595 filed on Feb. 22, 2018 which is incorporated herein by reference.

TECHNICAL FIELD

The present invention relates to a pattern forming method, and more specifically relates to a pattern forming method capable of easily removing a discontinuous portion in a pattern while keeping resistance of the pattern low.

BACKGROUND ART

Conventionally, a photolithography technique has been widely used as a method for forming a pattern [complicated process. Therefore, a method involving less material loss and a simple process has been studied. For example, there is a method for forming a small-gage wire pattern by applying droplets containing a conductive material to a base material by an inkjet method. However, in the inkjet method, mist-like droplets may be scattered in addition to main droplets when an ink is ejected. The scattered mist-like ink forms a discontinuous portion (a portion containing a conductive material and applied at a position different from a desired pattern so as to be isolated) on a base material, and deteriorates transparency.

The present applicant discloses a technique of forming a closed geometrical figure on a base material with a linear liquid containing a conductive material, drying the linear liquid to deposit the conductive material along an edge, thereby forming a pattern intermediate containing the conductive material and formed by an inner small-gage wire and an outer small-gage wire, and furthermore, removing the inner small-gage wire of the pattern intermediate to form a pattern with a small-gage wire that remains without being removed (Patent Literature 1).

CITATION LIST

Patent Literature

Patent Literature 1: JP 2017-39109 A

SUMMARY OF INVENTION

Technical Problem

In the method for forming a pattern containing a conductive material, when a discontinuous portion formed due to a mist and a discontinuous portion formed due to a drawing method (for example, an inner small-gage wire in Patent Literature 1) are unnecessary in a product, it is required to remove the discontinuous portions. However, a technique of easily removing such a discontinuous portion while keeping resistance of a pattern low has not been sufficiently established.

Therefore, an object of the present invention is to provide a pattern forming method capable of easily removing a discontinuous portion in a pattern while keeping resistance of the pattern low.

Other objects of the present invention will become apparent from the following description.

Solution to Problem

The above problems are solved by the following inventions.

1.

A pattern forming method including at least a printing step of printing a pattern intermediate containing a conductive material on a base material, and a plating step of subjecting the pattern intermediate to an electroplating treatment, in which the pattern intermediate printed in the printing step has a plating target portion that is energized in the plating step and a discontinuous portion that is discontinuously formed from the plating target portion and is not energized in the plating step, and in the plating step, by performing an electroplating treatment using a plating solution containing at least two or more types of metal salts containing different types of metals and a complexing agent, the discontinuous portion of the pattern intermediate is removed to form a pattern constituted by the plating target portion covered with a plating film.

2.

The pattern forming method according to the item 1, in which the two or more types of metal salts contain at least a metal salt containing copper or nickel as a main metal, and a metal salt containing a metal having a difference of 1 V or less in standard electrode potential from the main metal.

3.

The pattern forming method according to the item 2, in which the two or more types of metal salts contain a metal salt containing copper as the main metal, and a metal salt containing nickel as the metal having a difference of 1 V or less in standard electrode potential from the main metal.

4.

The pattern forming method according to the item 2, in which the two or more types of metal salts contain a metal salt containing nickel as the main metal, and a metal salt containing any one of iron, tin, chromium, and copper as the metal having a difference of 1 V or less in standard electrode potential from the main metal.

5.

The pattern forming method according to the item 4, in which the two or more types of metal salts further contain a metal salt containing zinc.

6.

The pattern forming method according to any one of the items 1 to 5, in which in the printing step, by forming a closed geometrical figure on the base material with a linear liquid containing the conductive material, and subsequently drying the linear liquid to deposit the conductive material along an edge of the linear liquid, the conductive pattern intermediate having the discontinuous portion constituted by an inner small-gage wire and the plating target portion constituted by an outer small-gage wire is formed.

7.

The pattern forming method according to any one of the items 1 to 6, in which in the printing step, the conductive material is applied onto the base material by an inkjet method.

Advantageous Effects of Invention

The present invention can provide a pattern forming method capable of easily removing a discontinuous portion in a pattern while keeping resistance of the pattern low.

BRIEF DESCRIPTION OF DRAWINGS

FIG. 1A to FIG. 1D are diagrams illustrating an example of a printing step.

DESCRIPTION OF EMBODIMENTS

Figure 2:
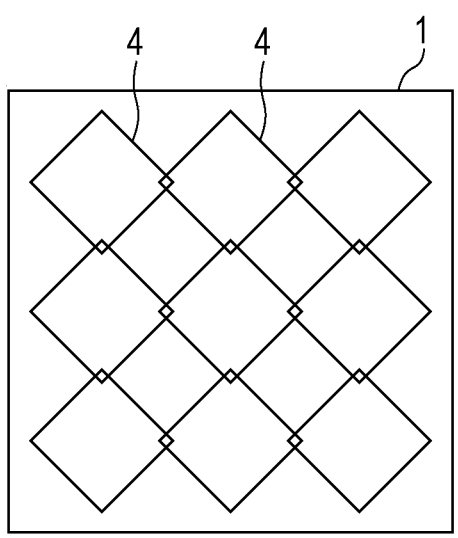
FIG. 2 is a diagram illustrating an example of a pattern after a plating step.

Hereinafter, an embodiment for carrying out the present invention will be described in detail.

1. Pattern Forming Method

A pattern forming method according to the present embodiment includes at least a printing step of printing a pattern intermediate containing a conductive material on a base material, and a plating step of subjecting the pattern intermediate to an electroplating treatment, in which the pattern intermediate printed in the printing step has a plating target portion that is energized in the plating step and a discontinuous portion that is discontinuously formed from the plating target portion and is not energized in the plating step, and in the plating step, by performing an electroplating treatment using a plating solution containing at least two or more types of metal salts containing different types of metals and a complexing agent, the discontinuous portion of the pattern intermediate is removed to form a pattern constituted by the plating target portion covered with a plating film.

According to such a pattern forming method, it is possible to easily remove the discontinuous portion while keeping resistance of the pattern low. As described above, examples of the discontinuous portion include a discontinuous portion formed due to a mist and a discontinuous portion formed due to a drawing method (for example, an inner small-gage wire in Patent Literature 1). Particularly when a transparent conductive film or the like is formed by a pattern, low visibility and transparency of the pattern can be improved by removing the discontinuous portion.

Hereinafter, the printing step and the plating step included in the pattern forming method will be described in more detail.

(1) Printing Step

In the printing step, a pattern intermediate containing a conductive material is printed on a base material. In the present embodiment, in the printing step, a pattern intermediate having a plating target portion that is energized in the subsequent plating step and a discontinuous portion that is discontinuously formed from the plating target portion and is not energized in the plating step is printed.

[Pattern Intermediate]

The pattern intermediate contains a conductive material and has a plating target portion and a discontinuous portion. The plating target portion is a portion that is energized by an electrode for an electroplating treatment (a power supplying electrode and usually a cathode) in the subsequent plating step. Meanwhile, the discontinuous portion is discontinuously formed from the plating target portion, and is not energized by an electrode for an electroplating treatment.

That is, in the pattern intermediate, the plating target portion and the discontinuous portion are formed discontinuously so as to be mutually insulated. Out of the mutually insulated portions constituting the pattern intermediate, the plating target portion is a portion that is energized in the subsequent plating step, and the discontinuous portion is a portion that is not energized in the subsequent plating step. Out of the mutually insulated portions constituting the pattern intermediate, which is selected as the plating target portion and which is selected as the discontinuous portion can be determined arbitrarily, and can be determined depending on a purpose, an application, and the like.

The shape of the pattern intermediate is not particularly limited and may be, for example, linear or solid, and the pattern intermediate can be formed in a desired shape on a base material. It is preferable to constitute the pattern intermediate with one or more conductive small-gage wires (conductive material applied linearly).

[Printing Method]

In the printing step, a printing method can be used in order to apply a conductive material onto a base material. The printing method is not particularly limited, and examples thereof include a screen printing method, a letterpress printing method, an intaglio printing method, an offset printing method, a flexographic printing method, and an inkjet method. Among the printing methods, the inkjet method is preferable. A droplet discharge method of an inkjet head in the inkjet method is not particularly limited, and examples thereof include a piezo method and a thermal method.

[Coffee Stain Phenomenon]

In the printing method, a coffee stain phenomenon can be utilized when an ink (liquid containing a conductive material) applied onto a base material is dried. By utilizing the coffee stain phenomenon, when a liquid containing a conductive material is dried, the conductive material can be selectively deposited along an edge of the liquid to form a conductive small-gage wire.

In a preferable example of the printing method utilizing the coffee stain phenomenon, first, a closed geometrical figure is formed on a base material with a linear liquid containing a conductive material, and subsequently the linear liquid is dried to deposit the conductive material along an edge of the linear liquid, thereby forming a conductive pattern intermediate formed by an inner small-gage wire and an outer small-gage wire. An example of such a printing method will be described with reference to FIG. 1A to FIG. 1D.

First, as illustrated in FIG. 1A, a plurality of linear liquids 2 each forming a quadrangle as a closed geometrical figure is formed in a longitudinal direction (up-down direction in the figure) of a base material 1 and a width direction (left-right direction in the figure) thereof at predetermined intervals.

Subsequently, as illustrated in FIG. 1B, when a linear liquid 2 is dried, the conductive material is deposited along an edge of the linear liquid 2 by utilizing the coffee stain phenomenon. At this time, since the closed geometrical figure has an inner peripheral edge and an outer peripheral edge as edges, a small-gage wire unit 5 constituted by an inner small-gage wire 3 containing a conductive material deposited on the inner peripheral edge and an outer small-gage wire 4 containing a conductive material deposited on the outer peripheral edge is formed.

In the small-gage wire unit 5, the outer small-gage wire 4 includes the inner small-gage wire 3 on an inner peripheral side. In the illustrated example, the inner small-gage wire 3 and the outer small-gage wire 4 are formed concentrically. The inner small-gage wire 3 and the outer small-gage wire 4 form quadrangles corresponding to the shapes of the inner peripheral edge of the linear liquid 2 and the outer peripheral edge thereof.

Subsequently, as illustrated in FIG. 1C, a plurality of linear liquids 2 each forming a quadrangle as a closed geometrical figure is formed in a longitudinal direction (up-down direction in the figure) of the base material 1 and a width direction (left-right direction in the figure) thereof at predetermined intervals. Here, the plurality of linear liquids 2 each forming a quadrangle is formed at positions sandwiched between the small-gage wire units 5 formed earlier. Here, a linear liquid 2 forming a quadrangle is disposed so as to be in contact with an outer small-gage wire 4 of a small-gage wire unit 5 adjacent to the linear liquid 2, but not to be in contact with an inner small-gage wire 3.

Subsequently, as illustrated in FIG. 1D, the small-gage wire units 5 constituted by the inner small-gage wires 3 and the outer small-gage wires 4 are further formed from the linear liquids 2 by utilizing the coffee stain phenomenon when the linear liquids 2 are dried, and the small-gage wire units 5 can be used as a pattern intermediate.

In the obtained pattern intermediate, outer small-gage wires 4 adjacent to each other are connected to each other. Meanwhile, an inner small-gage wire 3 is not connected to another inner small-gage wire 3 and is not connected to an outer small-gage wire 4. That is, the inner small-gage wires 3 are formed discontinuously from the outer small-gage wires 4 and are isolated in a pattern intermediate.

In the plating step described later, for example, by selecting the outer small-gage wires 4 as a plating target portion and removing the inner small-gage wires 3 as the discontinuous portion, the pattern illustrated in FIG. 2 can be formed.

In the example of FIG. 2, the inner small-gage wires 3 are removed, and the outer small-gage wires (also referred to simply as small-gage wires because the inner small-gage wires have been removed) 4 form a pattern. In such a pattern, the plurality of outer small-gage wires 4 is two-dimensionally arranged side by side in directions of the two diagonal lines of the quadrangles formed by the outer small-gage wires 4, and the outer small-gage wires 4 adjacent to each other cause both sides sandwiching a vertex to intersect and cross each other at two intersections.

In the example of FIG. 1A to FIG. 1D and FIG. 2, the linear liquid 2, the inner small-gage wire 3, and the outer small-gage wire 4 are quadrangular, but not limited thereto, and can each form a closed geometrical figure formed by a polygonal shape such as a triangle, a hexagon, or an octagon. The closed geometrical figure can include a curve element such as a circle or an ellipse.

In the above description, the case of forming a pattern intermediate constituted by a closed geometrical figure by utilizing the coffee stain phenomenon has been mainly described, but the present invention is not limited thereto, and various pattern intermediates can be formed. For example, a linear liquid having a linear shape, a curved shape, or a polygonal line shape is applied onto a base material, and a conductive material is deposited on both edges along a longitudinal direction of the linear liquid to form a pair of parallel lines from one linear liquid. The printing method does not necessarily need to utilize the coffee stain phenomenon. It is possible to form a pattern intermediate having a shape different from the shape of an ink applied onto a base material by the coffee stain phenomenon. However, the same shape as the shape of the ink applied onto the base material may be formed without utilizing the coffee stain phenomenon.

[Base Material]

A transparent base material is suitably used as a base material. The degree of transparency of the transparent base material is not particularly limited. The light transmittance of the transparent base material may be any value of several % to several tens %, and the spectral transmittance thereof may be any value. The light transmittance and the spectral transmittance can be appropriately determined depending on an application and a purpose.

A material of the base material is not particularly limited, and examples thereof include a polyethylene terephthalate (PET) resin, a polyethylene naphthalate (PEN) resin, a polybutylene terephthalate resin, a cellulose-based resin (polyacetyl cellulose, cellulose diacetate, cellulose triacetate, and the like), a polyethylene resin, a polypropylene-based resin, a methacrylic resin, a cyclic polyolefin-based resin, a polystyrene-based resin, an acrylonitrile-(poly) styrene copolymer (AS resin), an acrylonitrile-butadiene-styrene copolymer (ABS resin), a polyvinyl chloride-based resin, a poly (meth)acrylic resin, a polycarbonate-based resin, a polyester-based resin, a polyimide-based resin, a polyamide-based resin, a polyamideimide-based resin, and a cycloolefin polymer (COP) resin. By using these materials, favorable transparency can be imparted to the base material 1. In addition, particularly by using a synthetic resin material, favorable flexibility can be imparted to the base material 1. The base material 1 containing a synthetic resin material can be in a form of a film, and the film may be stretched or unstretched.

The shape of the base material is not particularly limited, and may be, for example, a plate shape (plate material). When the base material is a plate material, the thickness, size (area), and shape are not particularly limited, and can be appropriately determined depending on an application and a purpose of a transparent conductive film. The thickness of the plate material is not particularly limited, and can be, for example, about 1 μm to 10 cm, furthermore about 20 μm to 300 μm.

In addition, the base material may be subjected to a surface treatment for changing surface energy. Furthermore, the base material may have a hard coat layer, an antireflection layer, and the like.

[Ink]

Next, the printing method, in particular, an ink suitably used for the above-described coffee stain phenomenon will be described in detail.

The conductive material contained in the ink is not particularly limited, and examples thereof include conductive microparticles and a conductive polymer.

Examples of the conductive microparticles include metal microparticles and carbon microparticles.

Examples of a metal constituting the metal microparticles include Au, Pt, Ag, Cu, Ni, Cr, Rh, Pd, Zn, Co, Mo, Ru, W, Os, Ir, Fe, Mn, Ge, Sn, Ga, and In. Among these metals, Au, Ag, and Cu are preferable, and Ag is particularly preferable. The average particle diameter of the metal microparticles can be, for example, 1 to 100 nm, furthermore 3 to 50 nm. The average particle diameter is a volume average particle diameter, which can be measured by "Zetasizer 1000HS" manufactured by Malvern Instruments.

Examples of the carbon microparticles include graphite microparticles, carbon nanotube, and fullerene.

The conductive polymer is not particularly limited, but preferable examples thereof include a n-conjugated conductive polymer. Examples of the n-conjugated conductive polymer include a polythiophene and a polyaniline. The n-conjugated conductive polymer may be used together with a polyanion such as polystyrene sulfonic acid.

The concentration of the conductive material in the ink can be, for example, 5% by weight or less, furthermore 0.01% by weight or more and 1.0% by weight or less. This promotes the coffee stain phenomenon, and makes it possible to further thin the conductive small-gage wire.

A solvent used in the ink is not particularly limited, and the ink can contain one or more solvents selected from water and organic solvents. Examples of the organic solvents include an alcohol such as 1,2-hexanediol, 2-methyl-2,4-pentanediol, 1,3-butanediol, 1,4-butanediol, or propylene glycol, and an ether such as diethylene glycol monomethyl ether, diethylene glycol monoethyl ether, diethylene glycol monobutyl ether, triethylene glycol monomethyl ether, dipropylene glycol monomethyl ether, or dipropylene glycol monoethyl ether.

The ink can contain other components such as a surfactant. The surfactant is not particularly limited, and examples thereof include a silicon-based surfactant. The concentration of the surfactant in the ink can be, for example, 1% by weight or less.

[Drying of Ink]

A method for drying an ink (linear liquid) applied onto a base material may be natural drying or forced drying. A drying method used for the forced drying is not particularly limited, and for example, a method for heating a surface of the base material to a predetermined temperature and a method for forming an air stream on the surface of the base material can be used singly or in combination thereof. The air stream can be formed by blowing or sucking air using, for example, a fan.

[Firing Treatment]

A pattern intermediate formed on a base material can be subjected to a firing treatment. The firing treatment can be performed as a pretreatment of the plating step, for example. Examples of the firing treatment include a light irradiation treatment and a heat treatment. For the light irradiation treatment, for example, gamma rays, X-rays, ultraviolet rays, visible light, infrared rays (IR), microwaves, or radio waves can be used. For the heat treatment, for example, hot air, a heating stage, or a heating press can be used.

(2) Plating Step

In the plating step, a pattern intermediate printed in the printing step is subjected to an electroplating treatment. As described above, the pattern intermediate has a plating target portion that is energized in the plating step and a discontinuous portion that is discontinuously formed from the plating target portion and is not energized in the plating step.

In the plating step, by performing an electroplating treatment using a plating solution containing at least two or more types of metal salts containing different types of metals and a complexing agent, the discontinuous portion of the pattern intermediate is removed to form a pattern constituted by the plating target portion covered with a plating film.

For example, while the pattern intermediate on the base material is immersed in the plating solution, an anode is brought into contact with the plating solution, a cathode is electrically connected to the plating target portion, and the plating target portion is energized to cover the plating target portion with a plating film. At this time, the discontinuous portion that is not energized can be removed by the plating solution.

A reason why the above action is exhibited by the plating solution is considered as follows. First, when one of the two or more types of metal salts contained in the plating solution mainly contributes to formation of the plating film, the other metal salts mainly function as an oxidant. The conductive material constituting the discontinuous portion of the pattern intermediate is oxidized by this oxidant. Furthermore, dissolution of the conductive material is promoted by the complexing agent contained in the plating solution. As a result, an etching function works to remove the conductive material. In electroplating, a complexing agent is generally used for promoting dissolution of an anode electrode. However, the present inventor has found that a complexing agent in the plating solution according to the present invention effectively removes the discontinuous portion as another effect by studies, and has completed the present invention. In normal etching, both the discontinuous portion and the plating target portion are removed, and it is difficult to selectively remove the discontinuous portion. However, according to the plating solution of the present embodiment, formation of the plating film has priority in the plating target portion, and the discontinuous portion can be selectively removed.

[Plating Solution]

The two or more types of metal salts containing different types of metals contained in the plating solution preferably contain at least a metal salt containing a main metal, and a metal salt containing a metal having a difference of 1 V or less in standard electrode potential from the main metal. At this time, the main metal is particularly preferably copper or nickel. The main metal is a metal having the highest molar concentration among the metals in the plating solution. When a plurality of types of metal salts containing the same main metal is present, the molar concentration of the main metal is the total molar concentration of the main metal constituting these metal salts. The "main metal" and the "metal having a difference of 1 V or less in standard electrode potential from the main metal" only need to have a difference of 1 V or less in standard electrode potential from each other, and either one may have a higher standard electrode potential.

The molar concentration of the main metal in the plating solution is not particularly limited, but is preferably in a range of 0.05 (mol/l) to 0.5 (mol/l).

The amount of the metal having a difference of 1 V or less in standard electrode potential from the main metal is preferably extremely small with respect to the amount of the main metal. For example, a molar concentration ratio between the "main metal" and the "metal having a difference of 1 V or less in standard electrode potential from the main metal" is preferably in a range of 1:0.001 to 1:0.05. A particularly preferable range is 1:0.003 to 1:0.02.

The two or more types of metal salts contained in the plating solution more preferably contain a metal salt containing copper as the main metal, and a metal salt containing nickel as the metal having a difference of 1 V or less in standard electrode potential from the main metal.

The two or more types of metal salts contained in the plating solution still more preferably contain a metal salt containing nickel as the main metal, and a metal salt containing any one of iron, tin, chromium, and copper as the metal having a difference of 1 V or less in standard electrode potential from the main metal.

Furthermore, when the two or more types of metal salts contained in the plating solution contain a metal salt containing nickel as the main metal, and a metal salt containing any one of iron, tin, chromium, and copper as the metal having a difference of 1 V or less in standard electrode potential from the main metal, particularly preferably, a metal salt containing zinc is further contained as the two or more types of metal salts. As a result, nickel that is the main metal forms a nickel-zinc alloy plating film on the plating target portion together with zinc. As a result, removal of the discontinuous portion and blackening (antireflection effect) by the nickel-zinc alloy plating act synergistically, and particularly excellent transparency and low visibility can be obtained.

When a metal salt containing zinc is used in combination as described above, the concentration (% by weight) of zinc in the plating solution only needs to be lower than that of the main metal, and is preferably higher than that of the "metal having a difference of 1 V or less in standard electrode potential from the main metal" contained separately. In particular, combined use of a metal salt containing zinc in the plating solution containing a metal salt containing nickel is preferable because a plating surface (plating film surface) can be blackened, and such blackening can synergistically reduce visibility in the present invention. A molar concentration ratio between the metal salt containing nickel and the metal salt containing zinc is preferably in a range of 1:0.3 to 1:0.6 from a viewpoint of favorably exhibiting such an effect.

In the above description, the metal salt containing copper is not particularly limited, and examples thereof include copper sulfate pentahydrate. The metal salt containing nickel is not particularly limited, and examples thereof include nickel sulfate hexahydrate, nickel ammonium sulfate hexahydrate, and nickel chloride. The metal salt containing iron is not particularly limited, and examples thereof include ferric chloride hexahydrate. The metal salt containing tin is not particularly limited, and examples thereof include stannous chloride. The metal salt containing chromium is not particularly limited, and examples thereof include chromic chloride. The metal salt containing zinc is not particularly limited, and examples thereof include zinc sulfate.

The complexing agent contained in the plating solution is not particularly limited, and those capable of promoting dissolution of the conductive material can be preferably used. One or more compounds selected from boric acid, citric acid, sodium thiocyanate, pyrophosphoric acid, ethylenediaminetetraacetic acid, and the like can be used. The concentration of the complexing agent in the plating solution is not particularly limited, but is preferably in a range of 0.03 mol/L to 1 mol/L.

Water can be preferably used as a solvent of the plating solution. In addition to the components described above, the plating solution can appropriately contain other components within a range that does not impair the effects of the present invention. Examples of other components contained in the plating solution include hydrochloric acid, a gloss imparting agent, a surfactant, and a pH buffering agent.

In the plating step using the plating solution described above, for example, when the pattern intermediate illustrated in FIG. 1D is subjected to an electroplating treatment in the plating solution, by electrically connecting the outer small-gage wire 4 that is the plating target portion to an electrode for an electroplating treatment (a power supplying electrode and usually a cathode) to energize the outer small-gage wire 4, a plating layer can be formed on the outer small-gage wire 4. At this time, the inner small-gage wire 3 that is the discontinuous portion is discontinuously formed from the outer small-gage wire 4 that is the plating target portion, and therefore is excluded from an energization path and is not energized. By removing the inner small-gage wire 3 by the action of the plating solution, the pattern illustrated in FIG. 2 can be formed. The pattern illustrated in FIG. 2 is constituted by the outer small-gage wire 4, and the inner small-gage wire 3 has been removed therefrom.

As described above, by removing the discontinuous portion (here, the inner small-gage wire 3) that is a part of the pattern intermediate, and forming a pattern by the plating target portion (here, the outer small-gage wire 4) covered with a plating film, an arbitrary lattice interval (arrangement interval of small-gage wires) can be imparted to the pattern.

When one transparent conductive film is formed by a plurality of conductive small-gage wires arranged side by side, the isolated discontinuous portion in the pattern intermediate not only hardly contributes to conductivity of the transparent conductive film but also deteriorates transmittance and transparency. By removing the discontinuous portion, the transmittance and transparency of the transparent conductive film can be improved.

Furthermore, since the plating film is stacked on the plating target portion by the plating step, the obtained pattern has a low resistance, and excellent conductivity can also be obtained.

The discontinuous portion is not limited to the above-described inner small-gage wire and can have various shapes. Preferably, the discontinuous portion is formed intentionally or unintentionally in the printing step, and is unnecessary in a final product. The discontinuous portion may be formed, for example, by unintentional attachment of an ink mist or the like onto a base material in the printing step for printing the plating target portion. Even such a discontinuous portion can be suitably removed by the plating step described above, and the quality of a final product can be improved. It is also possible to remove a plurality of types of discontinuous portions at the same time. For example, the above-described discontinuous portion formed by the inner small-gage wire and the above-described discontinuous portion formed due to a mist may be removed at the same time.

[Plurality of Metal Layers]

In the plating step, the pattern intermediate may be subjected to a plurality of plating treatments with different plating solutions. In this case, plating metals may be different among the plating solutions in the plurality of plating treatments. By performing the plurality of plating treatments, it is possible to stack a plurality of metal layers (plating films) on the plating target portion. When the plurality of plating treatments is performed, in at least one plating treatment, preferably in at least the first plating treatment, an electroplating treatment is preferably performed using a plating solution containing at least two or more types of metal salts containing different types of metals and a complexing agent to remove the discontinuous portion.

(3) Others

An application of a pattern formed by the printing step and the plating step described above or a patterned base material having the pattern on the base material is not particularly limited, and the pattern or the patterned base material can be used for various applications.

It is preferable to use a pattern formed by a plurality of conductive small-gage wires arranged side by side as one transparent conductive film. The transparent conductive film can be utilized as a transparent electrode, for example, in various devices included in various electronic devices, and specifically can be used as a transparent electrode for various types of displays such as a liquid crystal, a plasma, an organic electroluminescence, and field emission.

The transparent electrode can be used as a transparent electrode of, for example, a touch panel, a mobile phone, electronic paper, various solar cells, and various electroluminescence light control elements. In particular, the transparent electrode can be used for a touch panel sensor of an electronic device such as a smartphone or a tablet terminal. When the transparent electrode is used as a touch panel sensor, the transparent electrode can be used as a position detection electrode (X electrode and Y electrode).

Note that the term "transparent" does not mean that the conductive small-gage wire itself constituting the transparent conductive film is transparent, and the entire transparent conductive film only needs to be able to transmit light (for example, via a region where the conductive small-gage wire is not disposed).

It is also preferable to use a pattern formed by one or more conductive small-gage wires as electric wiring or the like constituting an electric circuit.

EXAMPLES

Hereinafter, Examples of the present invention will be described, but the present invention is not limited by the Examples.

(Test 1)
1. Pattern forming method
(1) Printing step
[Preparation of Ink]

An ink (liquid containing a conductive material) having the following composition was prepared.

Silver nanoparticles (average particle size: 20 nm): 0.2% by weight
Surfactant ("BYK348" manufactured by BYK): 0.05% by weight
Diethylene glycol monobutyl ether (abbreviation: DEGBE) (dispersion medium): 25% by weight
Water (dispersion medium): Balance

[Preparation of Base Material]

As the base material, a PET base material which had been surface-treated such that the contact angle of a liquid containing a conductive material was 20.3° was prepared. As the surface treatment, a corona discharge treatment was performed using "PS-1M" manufactured by Shinko Electric & Instrumentation Co., Ltd.

[Printing of Pattern Intermediate]

While an inkjet head ("KM1024iLHE-30" (standard droplet volume 30 pL) manufactured by Konica Minolta Co., Ltd.) was moved relative to the base material, an ink was discharged from the inkjet head to form a plurality of closed geometrical figures with the linear liquid 2 containing a conductive material on the base material 1, as illustrated in FIG. 1A. The geometrical figure is a quadrangle in which sides are inclined at 45° with respect to a longitudinal direction of the base material 1.

By drying the linear liquid 2, the conductive material was selectively deposited on an inner edge and an outer edge of the linear liquid 2. As illustrated in FIG. 1B, a plurality of small-gage wire units 5 each including the inner small-gage wire 3 and the outer small-gage wire 4 was formed.

Each of the inner small-gage wire 3 and the outer small-gage wire 4 of the obtained small-gage wire unit 5 is a quadrangle in which sides are inclined at 45° with respect to a longitudinal direction of the base material 1. This quadrangle has a side length of 0.75 mm measured along a middle line between the inner small-gage wire 3 and the outer small-gage wire 4.

Subsequently, while the inkjet head was moved relative to the base material 1, an ink was discharged from the inkjet head to form a plurality of closed geometrical figures with the linear liquid 2 containing the conductive material on the base material 1, as illustrated in FIG. 1C. The geometrical figure is a quadrangle in which sides are inclined at 45° with respect to a longitudinal direction of the base material 1. The formation position of the linear liquid 2 was set such that the vicinity of the vertices of the quadrangle of the linear liquid 2 covered the vertices of the quadrangle of the outer small-gage wire of the small-gage wire unit 5 formed earlier.

By drying the linear liquid 2, the conductive material was selectively deposited on an inner edge and an outer edge of the linear liquid 2. As illustrated in FIG. 1D, a plurality of small-gage wire units 5 each including the inner small-gage wire 3 and the outer small-gage wire 4 was formed. Each of the inner small-gage wire 3 and the outer small-gage wire 4 of the obtained small-gage wire unit 5 is a quadrangle in which sides are inclined at 45° with respect to a longitudinal direction of the base material 1. This quadrangle has a side length of 0.75 mm measured along a middle line between the inner small-gage wire 3 and the outer small-gage wire 4.

An outer small-gage wire 4 of a small-gage wire unit 5 formed earlier and an outer small-gage wire 4 of a small-gage wire unit 5 formed later are connected to each other. An inner small-gage wire 3 of a small-gage wire unit 5 formed earlier and an inner small-gage wire 3 of a small-gage wire unit formed later are independent of each other without being connected to each other. Note that the inner small-gage wires 3 that are independent of each other without being connected to each other are discontinuous portions that are not energized in an electroplating treatment described later.

In the above steps, drying of the linear liquid 2 is promoted by patterning the linear liquid 2 on the base material 1 placed on a stage heated to 70° C. In addition, the formed inner small-gage wire 3 and outer small-gage wire 4 were subjected to a firing treatment for 10 minutes in an oven at 130° C. to be formed into a pattern intermediate of the conductive material.

(2) Plating Step
[Preparation of Plating Solution]

Plating solutions 1-1 to 1-3 each containing a metal salt containing copper as the main metal were prepared with the compositions illustrated in Table 1.

[Electroplating Treatment]

The pattern intermediate printed in the printing step was subjected to an electroplating treatment using each of the above plating solutions 1-1 to 1-3. As a result, the inner small-gage wire 3 was removed, and the outer small-gage wire 4 was left without being removed to form a pattern similar to that illustrated in FIG. 2. Electroplating was performed under the following plating conditions. Hereinafter, tests using the plating solutions 1-1 to 1-3 are referred to as tests 1-1 to 1-3, respectively.

<Plating Conditions>

The base material on which the pattern intermediate was formed was cut into a size of 70×140 mm to prepare a test piece. The outer small-gage wire 4 constituting the pattern intermediate of the test piece was electrically connected to a cathode and energized, and an electroplating treatment was performed in a plating solution at room temperature (20° C.). At this time, an anode was connected to a copper plate for plating, and the test piece was placed at a position 30 mm away from the copper plate in the plating solution. An electroplating treatment was performed at a constant current of 0.15 A for 90 seconds. After plating was completed, the test piece was washed with water and dried.

2. Evaluation Method

Each pattern obtained by the plating step was evaluated by the following evaluation methods.

(1) Transmittance

The transmittance [%] is a total light transmittance [%] measured using AUTOMATIC HAZEMETER (MODEL TC-H III DP) manufactured by Tokyo Denshoku Co., Ltd. Note that correction was performed using a base material (film) having no pattern, and measurement was performed as the total light transmittance of the formed pattern.

(2) Low Visibility

A sample was visually observed on a light table, and a distance at which a small-gage wire was visible was evaluated. In the following evaluation criteria, if a sample has an evaluation rank of A or higher, the sample can be preferably used in an application as a transparent conductive film. Note that an evaluation rank (⊙ ○ Δ x) is an average value evaluated by 18 people excluding the most inferior evaluation value and the most superior evaluation value from results evaluated by 20 people arbitrarily selected.

[Evaluation Criteria]

⊙: A small-gage wire is not visible at a distance of 15 cm
○: A small-gage wire is visible at a distance of 15 cm, but not visible at a distance of 30 cm
Δ: A small-gage wire is visible at a distance of 30 cm, but not visible at a distance of 50 cm
x: A small-gage wire is visible at a distance of 50 cm (3) Sheet Resistance Value A sheet resistance value [Ω/□] is a value measured by using a Loresta EP (MODEL MCP-T360 type) in-series 4-point probe (ESP) manufactured by Dia Instruments Co., Ltd.

Table 1 illustrates the above results.

TABLE 1

| | | Plating solution No. (Test No.) | | |
|---|---|---|---|---|
| | | 1-1 | 1-2 | 1-3 |
| Metal salt [g] | Copper sulfate pentahydrate | 20.0 | 20.0 | 20.0 |
| | Nickel sulfate hexahydrate | 0.20 | — | 0.20 |
| Complexing agent [g] | Boric acid | 5.0 | 5.0 | — |
| 1N hydrochloric acid [g] | | 1.3 | 1.3 | 1.3 |
| Gloss imparting agent ("ST901C" manufactured by Meltex Inc.) [g] | | 5.0 | 5.0 | 5.0 |
| Deionized water | | 1 L balance | 1 L balance | 1 L balance |
| Evaluation | Transmittance [%] | 93.4 | 91.3 | 91.5 |
| | Low visibility | Δ | X | X |
| | Resistance [Ω/□] | 7.1 | 6.9 | 6.9 |
| Note | | Present invention | Comparative example | Comparative example |

3. Evaluation

Table 1 indicates that when a plating solution containing a metal salt containing copper as the main metal is used, test 1-1 using the plating solution 1-1 containing at least two or more types of metal salts containing different types of metals and a complexing agent has excellent transmittance and low visibility of a pattern even though having almost no change in resistance as compared with test 1-2 using the plating solution 1-2 not containing two or more types of metal salts containing different types of metals, or test 1-3 using the plating solution 1-3 not containing a complexing agent.

(Test 2)

In Test 1, a pattern was formed in a similar manner to Test 1 except that "(2) plating step" was changed as follows.

[Preparation of Plating Solution]

Plating solutions 2-1 to 2-5 each containing a metal salt containing nickel as the main metal were prepared with the compositions illustrated in Table 2.

[Electroplating Treatment]

The pattern intermediate printed in the printing step was subjected to an electroplating treatment using each of the above plating solutions 2-1 to 2-5. As a result, the inner small-gage wire 3 was removed, and the outer small-gage wire 4 was left without being removed to form a pattern similar to that illustrated in FIG. 2. Electroplating was performed under the following plating conditions. Hereinafter, tests using the plating solutions 2-1 to 2-5 are referred to as tests 2-1 to 2-5, respectively.

<Plating Conditions>

The base material on which the pattern intermediate was formed was cut into a size of 70×140 mm to prepare a test piece. The outer small-gage wire 4 constituting the pattern intermediate of the test piece was electrically connected to a cathode and energized, and an electroplating treatment was performed in a plating solution heated to 50° C. At this time, an anode was connected to a nickel plate for plating, and the test piece was placed at a position 30 mm away from the copper plate in the plating solution. An electroplating treatment was performed at a constant current of 0.15 A for one minute. After plating was completed, the test piece was washed with water and dried.

2. Evaluation Method

Each pattern obtained by the plating step was evaluated by a similar evaluation method to test 1. Table 2 illustrates results thereof.

TABLE 2

| | | Plating solution No. (Test No.) | | | | |
|---|---|---|---|---|---|---|
| | | 2-1 | 2-2 | 2-3 | 2-4 | 2-5 |
| Metal salt [g] | Nickel sulfate hexahydrate | 48.0 | 48.0 | 48.0 | 48.0 | 48.0 |
| | Nickel chloride | 9.0 | 9.0 | 9.0 | 9.0 | 9.0 |
| | Ferric chloride hexahydrate | 0.68 | — | — | — | — |
| | Copper sulfate pentahydrate | — | 0.63 | 0.63 | — | 0.63 |
| Complexing agent [g] | Boric acid | 30.0 | 30.0 | — | 30.0 | — |
| | Citric acid | — | — | 93.2 | — | — |
| Deionized water | | 1 L balance | 1 L balance | 1 L balance | 1 L balance | 1 L balance |
| Evaluation | Transmittance [%] | 94.8 | 95.7 | 95.3 | 92.4 | 91.4 |
| | Low visibility | ○ | ○ | ○ | X | X |
| | Resistance [Ω/□] | 3.9 | 3.7 | 3.8 | 3.6 | 6.6 |
| Note | | Present invention | Present invention | Present invention | Comparative example | Comparative example |

3. Evaluation

Table 2 indicates that also when a plating solution containing a metal salt containing nickel as the main metal is used, like test 1, tests 2-1 to 2-3 using plating solutions 2-1 to 2-3 each containing at least two or more types of metal salts containing different types of metals and a complexing agent have excellent transmittance and low visibility of a pattern even though having almost no change in resistance as compared with test 2-4 using the plating solution 2-4 not containing two or more types of metal salts containing different types of metals, or test 2-5 using the plating solution 2-5 not containing a complexing agent.

(Test 3)

In Test 1, a pattern was formed in a similar manner to Test 1 except that "(2) plating step" was changed as follows.

[Preparation of Plating Solution]

Plating solutions 3-1 to 3-8 each containing a metal salt containing nickel as the main metal and further containing a metal salt containing zinc were prepared with the compositions illustrated in Table 3.

[Electroplating Treatment]

The pattern intermediate printed in the printing step was subjected to an electroplating treatment using each of the above plating solutions 3-1 to 3-8. As a result, the inner small-gage wire 3 was removed, and the outer small-gage wire 4 was left without being removed to form a pattern similar to that illustrated in FIG. 2. Electroplating was performed under the following plating conditions. Hereinafter, tests using the plating solutions 3-1 to 3-8 are referred to as tests 3-1 to 3-8, respectively.

<Plating Conditions>

The base material on which the pattern intermediate was formed was cut into a size of 70×140 mm to prepare a test piece. The outer small-gage wire 4 constituting the pattern intermediate of the test piece was electrically connected to a cathode and energized, and an electroplating treatment was performed in a plating solution heated to 50° C. At this time, an anode was connected to a nickel plate for plating, and the test piece was placed at a position 30 mm away from the copper plate in the plating solution. An electroplating treatment was performed at a constant current of 0.15 A for one minute. After plating was completed, the test piece was washed with water and dried.

2. Evaluation Method

Each pattern obtained by the plating step was evaluated by a similar evaluation method to test 1. Table 3 illustrates results thereof

TABLE 3

|  |  | Plating solution No. (Test No.) | | | | | | | |
| --- | --- | --- | --- | --- | --- | --- | --- | --- | --- |
|  |  | 3-1 | 3-2 | 3-3 | 3-4 | 3-5 | 3-6 | 3-7 | 3-8 |
| Metal salt [g] | Nickel sulfate hexahydrate | 14.0 | 14.0 | 14.0 | 14.0 | 14.0 | 14.0 | 14.0 | 14.0 |
|  | Nickel ammonium sulfate hexahydrate | 8.5 | 8.5 | 8.5 | 8.5 | 8.5 | 8.5 | 8.5 | 8.5 |
|  | Zinc sulfate | 5.5 | 5.5 | 5.5 | 5.5 | 5.5 | 5.5 | 5.5 | 5.5 |
|  | Ferric chloride hexahydrate | 0.20 | — | — | — | — | — | — | — |
|  | Chromic chloride hexahydrate | — | 0.20 | — | — | — | — | — | — |
|  | Stannous chloride | — | — | 0.19 | — | — | — | — | — |
|  | Copper sulfate pentahydrate | — | — | — | 0.02 | 0.04 | 0.19 | 0.56 | 0.19 |
| Complexing agent [g] | Sodium thiocyanate | 4.3 | 4.3 | 4.3 | 4.3 | 4.3 | 4.3 | 4.3 | — |
| Deionized water |  | 1 L balance | 1 L balance | 1 L balance | 1 L balance | 1 L balance | 1 L balance | 1 L balance | 1 L balance |
| Evaluation | Transmittance [%] | 95.2 | 95.0 | 95.3 | 94.1 | 95.8 | 95.8 | 93.9 | 91.5 |
|  | Low visibility | ⊙ | ⊙ | ⊙ | ○ | ⊙ | ⊙ | ○ | X |
|  | Resistance [Ω/□] | 4.0 | 4.1 | 4.0 | 3.8 | 3.9 | 3.9 | 3.8 | 6.7 |
| Note |  | Present invention | Present invention | Present invention | Present invention | Present invention | Present invention | Present invention | Comparative example |

3. Evaluation

Table 3 indicates that when a plating solution containing a metal salt containing nickel as the main metal and further containing a metal salt containing zinc is used, tests 3-1 to 3-7 using the plating solutions 3-1 to 3-7 each containing at least a metal salt containing iron, tin, chromium, or copper and a complexing agent have excellent transmittance and low visibility of a pattern even though having almost no change in resistance as compared with test 3-8 using the plating solution 3-8 not containing a complexing agent. Regarding the low visibility in tests 3-1 to 3-7, a particularly excellent effect was exhibited because removal of a discontinuous portion and blackening (antireflection effect) by nickel-zinc alloy plating acted synergistically.

REFERENCE SIGNS LIST

1 Base material
2 Linear liquid
3 Inner small-gage wire (discontinuous portion)
4 Outer small-gage wire (plating target portion)
5 Small-gage wire unit

The invention claimed is:

1. A pattern forming method comprising at least printing a pattern intermediate containing a conductive material on a base material, and subjecting the pattern intermediate to an electroplating treatment, wherein
the plating intermediate includes a plurality of pattern elements arranged on the base material in an array,
the pattern intermediate printed in the printing has a plating target part that is energized in the plating and a discontinuous part that is discontinuously formed from the plating target part and is not energized in the plating, and
in the plating, by performing an electric field plating treatment using a plating solution containing at least two or more types of metal salts containing different types of metals and a complexing agent, the discontinuous part of the pattern intermediate is removed to form a pattern constituted by the plating target part covered with a plating film;
wherein in the printing, by depositing on the base material with a linear liquid containing the conductive material, and subsequently drying the linear liquid to deposit the conductive material along an edge of the linear liquid, the conductive pattern intermediate having the discontinuous part constituted by an inner small-gage wire and the plating target part constituted by an outer small-gage wire is formed;
wherein each of the pattern elements includes:
the outer small-gage wire defining an outer peripheral edge of a closed geometric figure; and
the inner small-gage wire defining an inner peripheral edge of the closed geometric figure; and
wherein the respective outer peripheral edges of adjacent pattern elements overlap, while the respective inner peripheral edges of the adjacent pattern elements do not overlap.

2. The pattern forming method according to claim 1, wherein the two or more types of metal salts contain at least a metal salt containing copper or nickel as a main metal, and a metal salt containing a metal having a difference of 1 V or less in standard electrode potential from the main metal.

3. The pattern forming method according to claim 2, wherein the two or more types of metal salts contain a metal salt containing copper as the main metal, and a metal salt containing nickel as the metal having a difference of 1 V or less in standard electrode potential from the main metal.

4. The pattern forming method according to claim 3, wherein in the printing, the conductive material is applied onto the base material by an inkjet method.

5. The pattern forming method according to claim 2, wherein the two or more types of metal salts contain a metal salt containing nickel as the main metal, and a metal salt containing any one of iron, tin, chromium, and copper as the metal having a difference of 1 V or less in standard electrode potential from the main metal.

6. The pattern forming method according to claim 5, wherein the two or more types of metal salts further contain a metal salt containing zinc.

7. The pattern forming method according to claim 6, wherein in the printing, the conductive material is applied onto the base material by an inkjet method.

8. The pattern forming method according to claim 5, wherein in the printing, the conductive material is applied onto the base material by an inkjet method.

9. The pattern forming method according to claim 1, wherein in the printing, the conductive material is applied onto the base material by an inkjet method.

10. The pattern forming method according to claim 2, wherein in the printing, the conductive material is applied onto the base material by an inkjet method.

* * * * *